United States Patent
Bretschneider

(10) Patent No.: US 6,819,092 B2
(45) Date of Patent: Nov. 16, 2004

(54) DIGITALLY SWITCHABLE CURRENT SOURCE

(75) Inventor: Ernst Bretschneider, Erfurt (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 27 days.

(21) Appl. No.: 10/264,899

(22) Filed: Oct. 4, 2002

(65) Prior Publication Data

US 2003/0067290 A1 Apr. 10, 2003

(30) Foreign Application Priority Data

Oct. 9, 2001 (DE) .......................................... 101 49 769

(51) Int. Cl.[7] .............................................. G05F 3/16
(52) U.S. Cl. ..................... 323/313; 323/316; 327/538
(58) Field of Search ............................... 323/313, 314, 323/315, 316, 317; 327/530, 538–543; 331/17

(56) References Cited

U.S. PATENT DOCUMENTS

| | | | |
|---|---|---|---|
| 6,344,769 B1 * | 2/2002 | Giuroiu | 327/538 |
| 6,407,594 B1 * | 6/2002 | Milazzo et al. | 327/112 |
| 2001/0002115 A1 | 5/2001 | Hwang et al. | 331/17 |

* cited by examiner

*Primary Examiner*—Jessica Han
(74) *Attorney, Agent, or Firm*—Peter Zawiiski

(57) ABSTRACT

To provide a digitally switchable current source, by means of which no dangerous current spikes are produced at the switching instants, two digitally controllable switching transistors (MNn1, MNn2) are arranged in series with at least two parallel-arranged transistors (MNn) which are controllable by means of an analog voltage, while one of the two switching transistors is switched with the relevant inverted control signal and each one of the two switching transistors (MNn1, MNn2) is arranged in the current circuit whose current is to be controlled by the current source.

4 Claims, 2 Drawing Sheets

DIGITALLY SWITCHABLE CURRENT SOURCE

Figure 1:
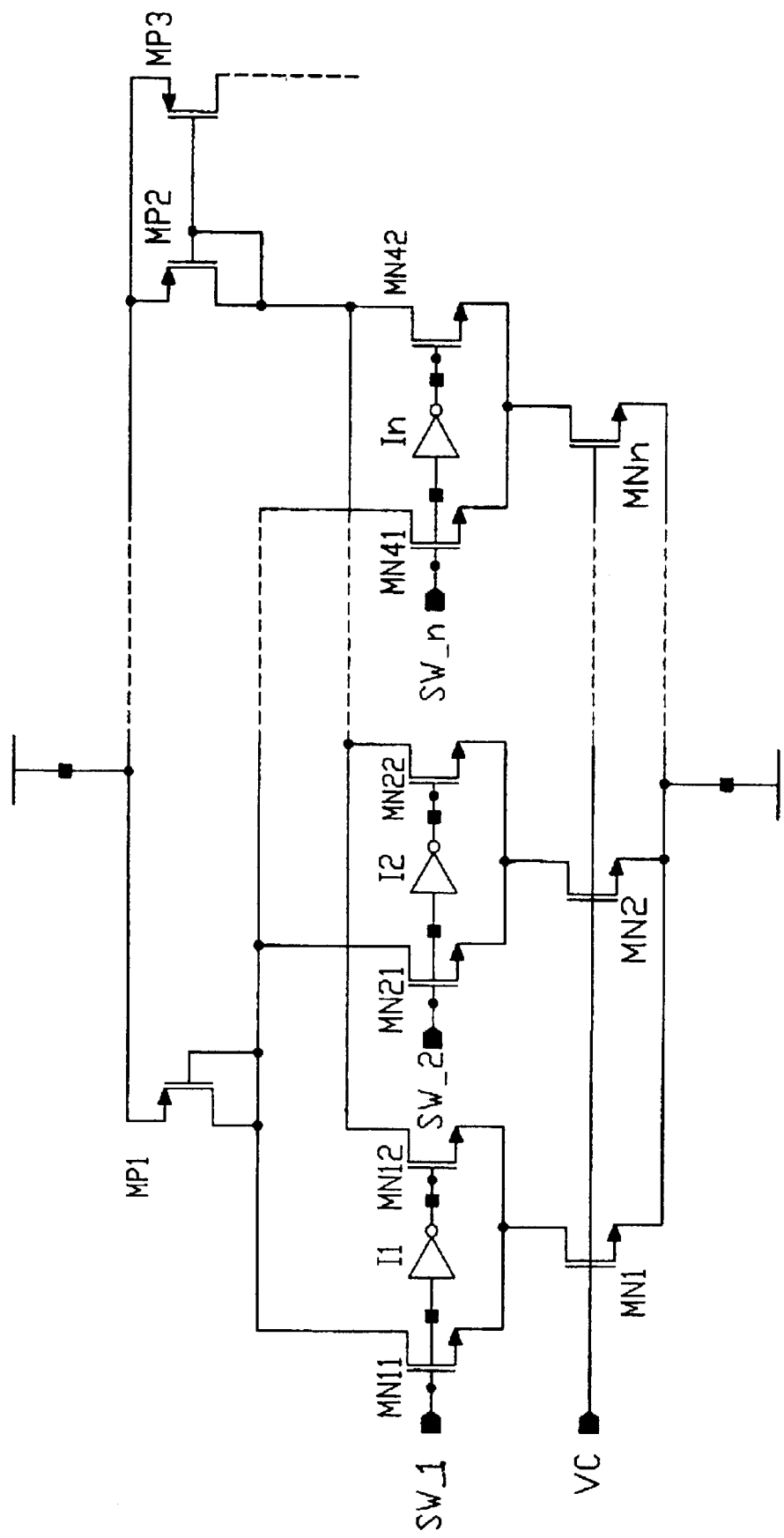

The invention relates to a digitally switchable current source.

In electronic circuits, constant current sources are often required, whose output current must be corrected to a given value after the manufacturing process or whose output current must be varied within given limits.

Inter alia, controllable current sources whose adjusting transistors are driven by an analog control voltage or constant current sources with switchable output stages are known.

A general problem in circuits with switchable constant currents is the generation of current peaks at the switching instants, which peaks lead to damage of the components used or may affect the function of a subsequent circuit arrangement.

It is an object of the invention to provide a digitally switchable current source for arbitrary current values at which no dangerous current peaks are produced at the switching instants.

According to the invention, the object is solved by the characteristic features of claim 1. Further appropriate embodiments are defined in the dependent claims.

In accordance therewith, two digitally controllable switching transistors are arranged in series with at least two parallel-arranged transistors which are controllable by means of an analog voltage, while an element for signal inversion is arranged between the control electrodes (gates) of said switching transistors, one of the two switching transistors being situated in the current circuit whose current is to be controlled by the current source. The parallel, second inversely controlled switching transistor is used for suppressing the current peaks, referred to as spikes, at the switching instant.

The invention has the advantage that an output current of a defined value can be generated. The current source may comprise an arbitrary number of individual constant current sources with the associated switching transistors. The ratio between these current sources may be weighted differently, for example, in a binary form or digitally. The value of the generated current results as a sum from the actively switched paths.

These and other aspects of the invention are apparent from and will be elucidated with reference to the embodiments described hereinafter.

Figure 2:
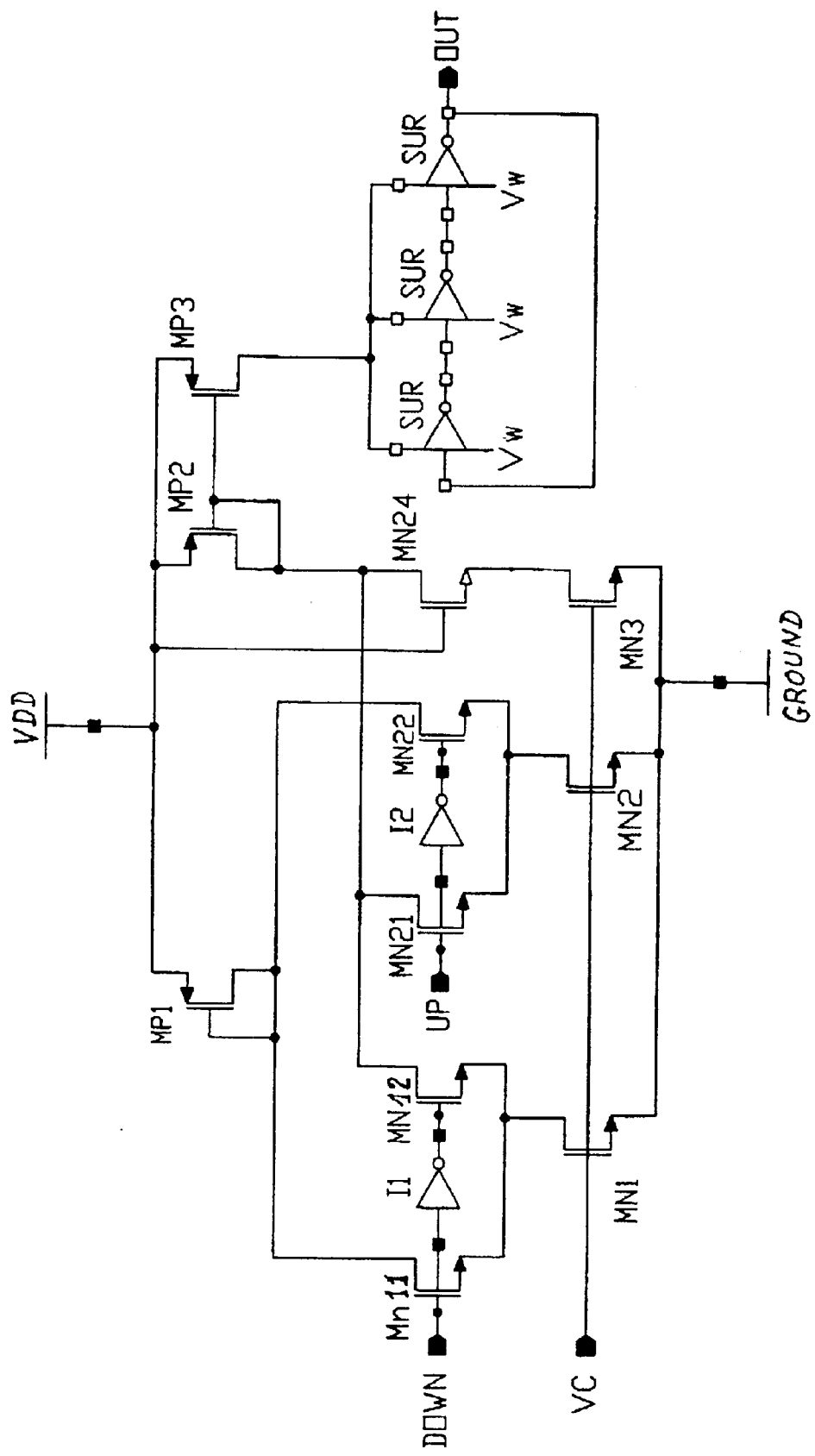

In the drawing:

FIG. 1 is a circuit diagram of the current source according to the invention, and FIG. 2 is an example of using the current source in a PLL circuit.

FIG. 1 is a circuit diagram of the current source. The current source comprises a plurality of adjusting transistors MN1 . . . MNn controlled by a common analog voltage VC and operating as a current source. Arranged in series with each adjusting transistor are two switching transistors MN1 and MN12 to MNn1 and MNn2, whose control electrodes (gates) are controlled by a digital signal at switching inputs SW_1 to SW_n or their inversion. The outputs of the switching transistors are connected either to the load transistor MP1 or to MP2, so that two alternative current paths are obtained. By applying a high signal to the switching inputs SW_1 . . . SW_n, there is a switch-over from a current through the transistor MP1 to a current path through the transistor MP2 and a switch-back again at a lower signal because, due to the inversion by inverters I1 . . . In, which are arranged between the control electrodes of the two switching transistors MN11 and MN12 to MNn1 and MN2 arranged in series with each adjusting transistor, always one of the switching transistors MN11, MN22 . . . MNn1, MNn2 are controlled in the forward direction. Since the current flow through the transistors MN1 . . . MNn is thus not interrupted, no current spikes occur at the switching instants. Transistor MP2 is to be considered as an output of the circuit with which a transistor MP3 can be controlled. The current value at the output is always obtained as the sum of the currents of those transistors MN1 . . . MNn which are switched by a high signal at the switching inputs SW1 . . . SWn in the current path through the transistor MP2.

FIG. 2 shows a possible use of the current source for a PLL circuit (phase-locked loop). The PLL circuit is a frequency-selective circuit in which a phase detector, a filter, an amplifier and a voltage-controlled oscillator (VCO) are arranged to form a control circuit. The control voltage VC of the oscillator is converted by means of a modification of the above-described digitally switchable current source to an equivalent current and applied via three possible paths to the output transistor MP2 which thereby influences the frequency of the oscillator. Due to the switching transistors MN11, MN12 and MN21, MN22, the digital signals UP and DOWN which are generated from the phase difference between the nominal value and the actual value of the output frequency, influence the current through the output transistor MP2 and hence the lock-in behavior of the PLL.

If the nominal and the actual value of the frequency correspond, the phase difference is zero and the signals UP and DOWN are at ground potential (GROUND). The current feeding the VCO flows through the paths MN1, MN12, MP2 and MN3, MN24, MP2. When the frequency of the VCO deviates upwards, the signal DOWN is set at the supply potential (VDD) and thereby turns on the transistor MN11 and turns off the transistor MN12. The current of the transistor MN1 now flows via the path MN11, MP1 and thereby reduces the overall current of the transistor MP2 and thus the frequency of the VCO. In the reverse case, i.e. when the output frequency is too low, the signal UP is set at VDD level and the oscillator receives an increased current through the path MN2, MN21, MP2 for the duration of this signal.

In addition to a shorter lock-in time of the PLL, the advantage of the circuit is particularly the reduction of frequency jitter of the oscillator because current spikes are avoided during the switching instants.

List of Reference Signs
MNn transistor
MNn1 switching transistor
MNn2 switching transistor
MPn transistor
IN inverter
VC control voltage
VCO oscillator
$SW_{1 \ldots n}$ switching input

What is claimed is:

1. A digitally switchable current source, characterized in that two switching transistors, which are controllable by means of a digital control signal, are arranged in series with at least two current source transistors which are controllable by means of an analog voltage and are parallel arranged in a branch, wherein current flowing through the source transistors remains constant during state transitions of the digital control signal.

2. A digitally switchable current source as claimed in claim 1, characterized in that the relevant digital control signal of each branch is applied in an inverted form to one of the two switching transistors.

3. A digitally switchable current source as claimed in claim 1, characterized in that the outputs of the switching transistors terminate either in the current path to be controlled or in a parallel, load-equivalent, passive current path.

4. A phase-locked loop circuit, comprising:

a digitally switchable current source, including at least two switching transistors controllable by means of a digital control signal arranged in series with at least two current source transistors which are controllable by means of an analog voltage and are parallel arranged in a branch, wherein current flowing through the source transistors remains constant during state transitions of the digital control signal; and a voltage-controlled oscillator adapted to provide an output frequency in response to the current source transistors.

* * * * *